US012620365B2

(12) United States Patent
Song et al.

(10) Patent No.: US 12,620,365 B2
(45) Date of Patent: May 5, 2026

(54) GATE DRIVER AND DISPLAY DEVICE INCLUDING SAME

(71) Applicant: Samsung Display Co., Ltd., Yongin-Si (KR)

(72) Inventors: Hyungjin Song, Yongin-si (KR); Nackhyeon Keum, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 19/095,027

(22) Filed: Mar. 31, 2025

(65) Prior Publication Data

US 2025/0391375 A1 Dec. 25, 2025

(30) Foreign Application Priority Data

Jun. 25, 2024 (KR) ........................ 10-2024-0083178
Aug. 5, 2024 (KR) ........................ 10-2024-0104097

(51) Int. Cl.
*G09G 3/3266* (2016.01)
*G09G 3/3233* (2016.01)
*G11C 19/28* (2006.01)

(52) U.S. Cl.
CPC ......... *G09G 3/3266* (2013.01); *G09G 3/3233* (2013.01); *G09G 2300/0819* (2013.01); *G09G 2300/0842* (2013.01); *G09G 2300/0861* (2013.01); *G09G 2310/0286* (2013.01); *G09G 2310/08* (2013.01); *G09G 2330/022* (2013.01); *G11C 19/28* (2013.01)

(58) Field of Classification Search
CPC ......... G09G 3/3266; G09G 2310/0286; G09G 3/3233
See application file for complete search history.

(56) References Cited

U.S. PATENT DOCUMENTS

| | | | |
|---|---|---|---|
| 10,255,860 B2 | 4/2019 | Na et al. | |
| 2017/0032731 A1* | 2/2017 | Shim | .................... G09G 3/3677 |
| 2023/0274687 A1 | 8/2023 | In | |

FOREIGN PATENT DOCUMENTS

| | | |
|---|---|---|
| CN | 106328075 A | 1/2017 |
| KR | 10-2017-0081125 A | 7/2017 |
| KR | 10-2021-0083120 A | 7/2021 |

* cited by examiner

*Primary Examiner* — Koosha Sharifi-Tafreshi
(74) *Attorney, Agent, or Firm* — Innovation Counsel LLP

(57) ABSTRACT

A gate driver according to an embodiment includes a plurality of stages connected to a plurality of gate signal lines. Each of the plurality of stages may include a first transistor connected between a first terminal and an output node and transmitting a voltage of the first terminal to the output node in response to a voltage of a first control node, a second transistor connected between a second terminal and the output node and transmitting a voltage of the second terminal to the output node in response to a voltage of the second control node, and a third transistor diode-connected between the second control node and a third terminal to which a hold signal is input. The hold signal may maintain a first voltage during a first period and maintain a second voltage, different from the first voltage, during a second period.

20 Claims, 11 Drawing Sheets

OUT : OUT[1], OUT[2], OUT[3], OUT[4], ···, OUT[i], ···

GATE DRIVER AND DISPLAY DEVICE INCLUDING SAME

CROSS-REFERENCE TO RELATED APPLICATIONS

This application claims priority to and the benefit of Korean Patent Application No. 10-2024-0083178 filed on Jun. 25, 2024, and Korean Patent Application No. 10-2024-0104097 filed on Aug. 5, 2024, in the Korean Intellectual Property Office, the entire contents of which are incorporated herein by reference.

BACKGROUND

(a) Field

This disclosure relates to a gate driver and a display device including the same.

(b) Description of the Related Art

A display device displays an image based on image data received from a host processor (e.g., a graphics processing unit GPU or a graphics card).

On the other hand, if the rendering frequency of the host processor does not match the driving frequency of the display device, this frequency mismatch may cause a tearing phenomenon in which a boundary line appears in the image displayed on the display device. To prevent this tearing phenomenon, a variable-frequency mode has been developed to synchronize the rendering frequency of the host processor with the driving frequency of the display device.

In a display device that supports the variable-frequency mode, the driving sequence of the display panel includes an address scan period during which data voltage is written to the pixel, and a self-scan period during which no data voltage is written to the pixel and only light is emitted.

SUMMARY

Embodiments of the present disclosure provide a gate driver that may reduce power consumption when a display panel operates in a self-scan mode and a display device including the same.

According to an embodiment, a gate driver includes a plurality of stages connected to a plurality of gate signal lines. Each of the plurality of stages includes a first transistor connected between a first terminal and an output node and transmitting a voltage of the first terminal to the output node in response to a voltage of a first control node, a second transistor connected between a second terminal and the output node and transmitting a voltage of the second terminal to the output node in response to a voltage of the second control node, and a third transistor diode-connected between the second control node and a third terminal to which a hold signal is input. The hold signal maintains a first voltage during a first period and maintains a second voltage, different from the first voltage, during a second period.

A third voltage may be applied to the second terminal. The first voltage may be higher than the third voltage, and the second voltage may be lower than the third voltage.

A first clock signal may be applied to the first terminal. The first clock signal may be a signal having alternating periods of the first voltage and the third voltage alternate.

The third transistor may be turned on when the voltage level of the hold signal is the second voltage.

The second transistor may be a p-type transistor.

Each of the plurality of stages may further include a first control circuit configured to control a voltage level of the first control node.

The first control circuit may include a fourth transistor connected between a fourth terminal to which a start signal is input and a first node, and including a control electrode connected to the first terminal, a fifth transistor connected between the first node and the first control node, and including a control electrode connected to the second terminal, a sixth transistor including a first electrode connected to the fifth terminal through which a second clock signal, different from the first clock signal, is input, and a control electrode connected to the first control node, and a first capacitor connected between a second electrode of the sixth transistor and the first control node.

Toggling of the first clock signal and the second clock signal may be enabled during the first period and may be disabled during the second period.

Each of the plurality of stages may further include a second control circuit configured to control a voltage level of the second control node.

The second control circuit may include a fourth transistor connected between the second terminal and the first node and including a control electrode connected to the first terminal, a fifth transistor connected between the first node and the second node and including a control electrode connected to the second terminal, a sixth transistor connected between a fifth terminal through which a second clock signal, different from the first clock signal, is input and a third node, and including a control electrode connected to the second node, a seventh transistor connected between the third node and the second control node and including a control electrode connected to the fifth terminal, an eighth transistor connected between the first terminal and the second control node and including a control electrode connected to the first control node, and a ninth transistor connected between the first node and the first terminal and including a control electrode connected to the first control node. The second control circuit may further include a first capacitor connected between the second node and the third node, and a second capacitor connected between the first terminal and the second control node.

The second control circuit may further include a tenth transistor connected between the sixth transistor and the third node and including a control electrode connected to the second node.

During the first period a data voltage may be written to each pixel, and during the second period no data voltage may be written to each pixel.

According to an embodiment, a display device includes a display panel including a plurality of pixels connected to a plurality of gate signal lines and a plurality of data signal lines, a gate driver including a plurality of stages connected to the plurality of gate signal lines and configured to provide a plurality of gate signals, and a data driver connected to the plurality of data signal lines and configured to provide a plurality of data signals. Each of the plurality of stages includes a first transistor connected between a first terminal and an output node and transmitting a voltage of the first terminal to the output node in response to a voltage of the first control node, a second transistor connected between a second terminal and the output node and transmitting a voltage of the second terminal to the output node in response to a voltage of the second control node, and a third transistor diode-connected between the second control node and a third terminal to which a hold signal is input. The hold signal maintains a first voltage during a first period and maintains a second voltage, different from the first voltage, during a second period.

The display device may further include a hold signal generator configured to provide the hold signal. The hold signal generator may include a fourth terminal to which a hold control signal is input, a fifth terminal through which the hold signal is output, a fourth transistor connected between the fourth terminal and the fifth terminal and including a control electrode connected to a sixth terminal to which a third voltage is input, and a charge pump circuit configured to control a voltage level provided to the fifth terminal in response to the hold control signal and a clock signal.

The charge pump circuit may include a fifth transistor diode-connected between the fourth terminal and a first node, a sixth transistor diode-connected between the first node and the fifth terminal, a seventh transistor including a first electrode to which the first clock signal is input, a second electrode connected to a second node, and a control electrode connected to the fourth terminal, and a capacitor connected between the first node and the second node.

The charge pump circuit may be configured to provide the second voltage lower than the third voltage to the output terminal when the voltage level of the hold control signal is the third voltage.

A first clock signal may be input to the first terminal. The third voltage may be input to the second terminal. The first clock signal may be a signal having alternating periods of the first voltage and the third voltage. The first voltage may be higher than the third voltage, and the second voltage may be lower than the third voltage.

The third transistor may be turned on when the voltage level of the hold signal is the second voltage. The second transistor may be turned on when the second voltage is transmitted to the second control node by the third transistor.

During the first period a data voltage may be written to each pixel, and during the second period no data voltage may be written to each pixel.

Each of the plurality of stages may further include a first control circuit configured to control a voltage level of the first control node, and a second control circuit configured to control a voltage level of the second control node.

According to an embodiment, an electronic device includes a memory, a processor executing an application stored in the memory, and a display device comprising a display module displaying image based on an input image data from the application. The display device includes a display panel including a plurality of pixels and displaying image based on an input image data from the application, and a gate driver including a plurality of stages and connected to the plurality of pixels to provide gate signals. Each of the plurality of stages includes a first transistor connected between a first terminal and an output node and transmitting a voltage of the first terminal to the output node in response to a voltage of the first control node, a second transistor connected between a second terminal and the output node and transmitting a voltage of the second terminal to the output node in response to a voltage of the second control node, and a third transistor diode-connected between the second control node and a third terminal to which a hold signal is input. The hold signal maintains a first voltage during a first period and maintains a second voltage, different from the first voltage, during a second period.

According to embodiments, power consumption may be reduced when the display device operates in self-scan mode.

DETAILED DESCRIPTION OF THE EMBODIMENTS

Figure 1:
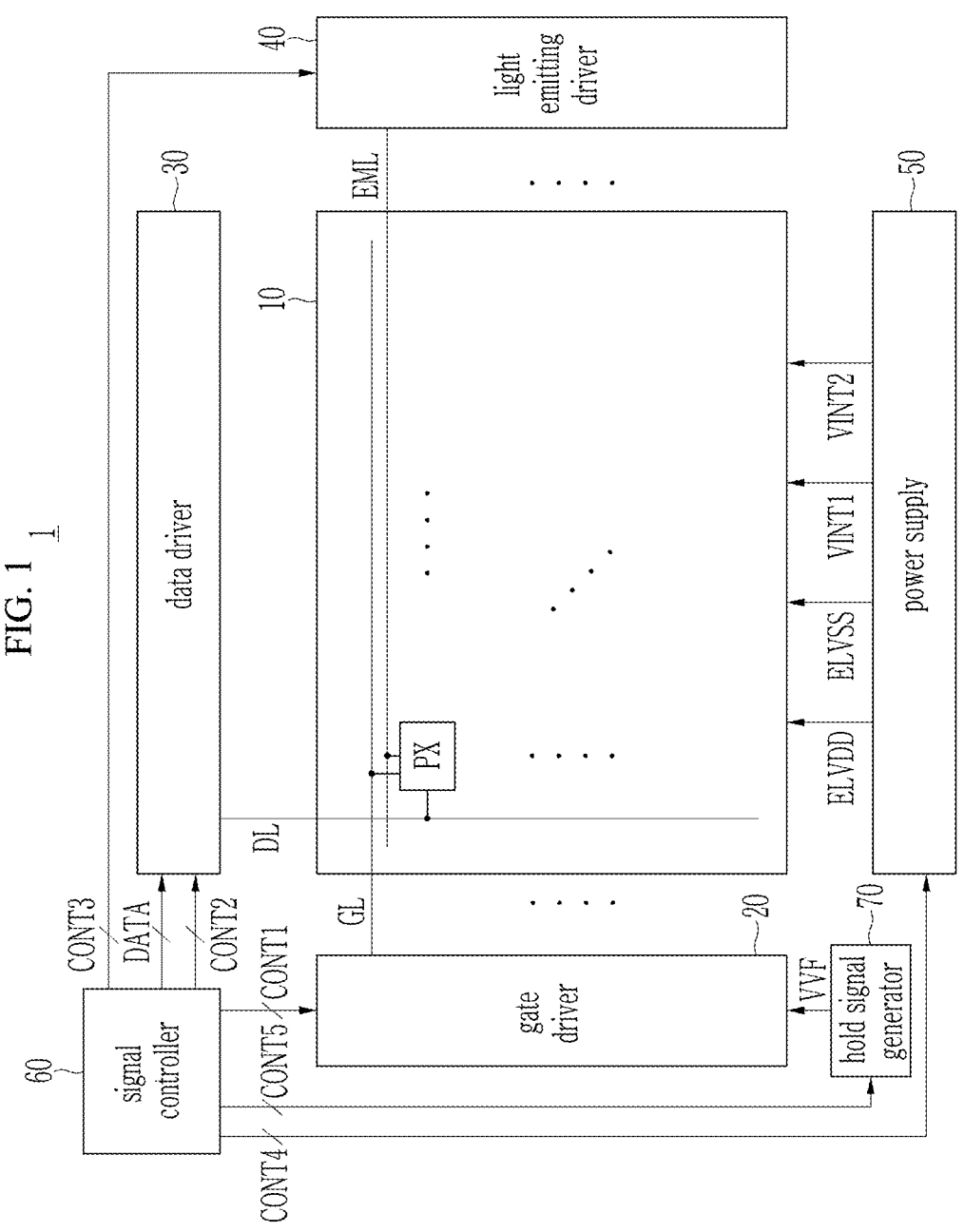
FIG. 1 schematically shows a display device according to an embodiment.

Hereinafter, with reference to the accompanying drawings, various embodiments of the present disclosure will be described in detail so that those skilled in the art may easily implement the present disclosure. The present disclosure may be implemented in many different forms and is not limited to the embodiments described herein.

In order to clearly explain the present disclosure, parts that are not relevant to the description are omitted, and identical or similar components are assigned the same reference numerals throughout the specification.

Ordinal numbers such as "first" and "second" are used to describe various components, but these components are not limited by these terms. These terms are only used to distinguish one component from another component, and unless specifically stated to the contrary, the first component may also be a second component.

In addition, throughout the specification, unless stated to the contrary, the word, "include," "comprise," or "have" and its variations such as "including," "comprising," "having," or etc. should be understood to imply the inclusion of the stated elements but not exclusion of any other elements.

FIG. 1 schematically shows a display device according to an embodiment.

Referring to FIG. 1, a display device 1 according to an embodiment may include a display panel 10, a gate driver 20, a data driver 30, a light emitting driver 40, a power supply 50, and a signal controller 60.

The display panel 10 may include a plurality of pixels PX and a plurality of signal lines for applying electrical signals to the plurality of pixels PX.

The signal lines for applying electrical signals to the plurality of pixels PX may include a plurality of gate signal lines GL and a plurality of light emitting control signal lines EML extending in a first direction (horizontal/row direction in FIG. 1), and a plurality of data signal lines DL extending in a second direction (vertical/column direction in FIG. 1).

The plurality of gate signal lines GL is spaced apart from each other along the second direction and may transmit gate signals to the pixels PX. The plurality of data signal lines DL is spaced apart from each other along the first direction and may transmit data signals to the pixels PX.

A plurality of pixels PX may be repeatedly arranged in the first direction and the second direction. A plurality of pixels PX may be arranged in various forms, such as a stripe arrangement, a PenTile arrangement, or a mosaic arrangement. Each of the plurality of pixels PX may be connected to a corresponding gate signal line among the plurality of gate signal lines GL, a corresponding light emitting control signal line among the plurality of light emitting control signal lines EML, and a corresponding data signal line among the plurality of data signal lines DL. In addition, although not directly shown in the display panel 10 of FIG. 1, each of the plurality of pixels PX is connected to a power supply line to receive a first power supply voltage ELVDD, a second power supply voltage ELVSS, initialization voltages VINT1, VINT2, etc.

Each of the plurality of pixels PX may include an organic light emitting diode OLED as a light emitting element (or display device). Each of the organic light emitting diode may receive driving current in response to the data signal transmitted through the corresponding data signal line. Each of the organic light emitting diode may display an image by emitting light of a certain brightness according to the supplied driving current. The gate driver 20 may be connected to a plurality of gate signal lines GL. The gate driver 20 may generate a gate signal in response to the control signal CONT1 received from the signal controller 60. The gate driver 20 may sequentially supply the generated gate signal to each pixel (PX) through the gate signal lines GL. Each gate signal line GL may be connected to the gate of a transistor included in the corresponding pixel PX. The gate signal may have an on-voltage level at which the transistor connected to the corresponding gate signal line GL may be turned on, and an off-voltage level at which the transistor may be turned off. The on-voltage may be a high-level voltage, and the off-voltage may be a low-level voltage. Alternatively, the on-voltage may be a low-level voltage, and the off-voltage may be a high-level voltage. The period during which the on-voltage of the gate signal is maintained and the period during which the off-voltage is maintained may vary depending on the operation performed by the transistor receiving the gate signal within each pixel PX of the display panel 10. The gate signal supplied to each pixel PX by the gate driver 20 may include a scan signal, a compensation signal, and an initialization signal. The plurality of gate signal lines may include a plurality of scan signal lines transmitting scan signals, a plurality of compensation signal lines transmitting compensation signals, and a plurality of initialization signal lines transmitting initialization signals.

The gate driver 20 includes a plurality of stages that sequentially generate and output gate signals, and each stage may include a shift register. Among the plurality of stages included in the gate driver 20, the first stage may be initiated or driven by a vertical start signal or the like delivered from the signal controller 60, and the stages following the first stage, e.g., the second and subsequent stages, may operate in a sequential drive manner in which each stage is initiated or driven by the output of the preceding stage. When driving is initiated, each stage may output a gate signal to the corresponding gate signal line GL.

The gate driver 20 may be implemented on the same substrate as the display panel 10.

The data driver 30 may be connected to a plurality of data signal lines DL. The data driver 30 may receive an image data signal DATA having gray scale from the signal controller 60. The data driver 30 may generate a data signal by converting the received image data signal DATA into a voltage or current and generate a data signal corresponding to each pixel PX. The data driver 30 may generate a data signal in response to a control signal CONT2 received from the signal controller 60. The data driver 30 may supply the generated data signal to each pixel PX through the data signal lines DL.

The light emitting driver 40 may be connected to a plurality of light emitting control signal lines EML. The light emitting driver 40 may generate a light emitting control signal in response to a control signal CONT3 received from the signal controller 60. The light emitting driver 40 may supply the generated light emitting control signal to each pixel PX through a plurality of light emitting control signal lines EML. The light emitting control signal may be transmitted to the emission control transistor in each pixel PX through the corresponding light emitting control signal line. A light emitting control transistor may control the light emission of the light emitting element of the corresponding pixel PX in response to the received light emitting control signal. The light emitting element may emit light with a brightness corresponding to the data signal or may not emit light depending on the control of the light emitting control transistor.

The power supply 50 may supply a first power voltage ELVDD, a second power voltage ELVSS, an initialization voltage VINT1, etc. to each pixel PX in the display panel 10. The first power voltage ELVDD may have a higher voltage level than the voltage level of the second power voltage ELVSS. The kind of voltage supplied from the power supply 50 is not particularly limited to the examples above. Voltage values may be set or controlled according to a control signal CONT4 transmitted from the signal controller 60.

The signal controller 60 may convert input image data received from the outside, e.g., a host processor, into an image data signal DATA and transmit it to the data driver 30. The signal controller 60 may generate control signals CONT1, CONT2, and CONT3 based on a synchronization signal, a clock signal, etc. received from the outside, e.g., a host processor. That is, the signal controller 60 includes a control signal CONT1 for controlling the operation of the gate driver 20, a control signal CONT2 for controlling the operation of the data driver 30, and a control signal CONT3 for controlling the operation of the light emitting driver 40. The signal controller 60 may transfer the generated control signals CONT1, CONT2, and CONT3 to the gate driver 20, data driver 30, and light emitting driver 40, respectively. The signal controller 60 may generate a control signal CONT4 to control the operation of the power supply 50 and transmit the control signal CONT4 to the power supply 50.

In an embodiment, the display device 1 may operate in a variable-frequency mode. In the variable-frequency mode, the display panel 10 may display an image based on a single set of image data over a plurality of frame periods. The display panel 10 may operate in an address scan mode in which data voltages are written to the pixels PX during one frame period among the plurality of frame periods during which the image is displayed based on the single set of image data. For the remaining frame periods among the plurality of frame periods, the display panel 10 may be operated in a self-scan mode in which no data voltages are written to the pixels PX and only light emission is performed.

In an embodiment, the display device 1 may sequentially supply gate signals to the pixels PX while operating in an address scan mode. For example, the signal controller 60 may generate a control signal CONT1 including a toggling clock signal and transmit the control signal CONT1 to the gate driver 20.

In an embodiment, the display device 1 may supply a gate signal at an off-voltage level to the pixels PX while operating in a self-scan mode. In the self-scan mode, the signal controller 60 may disable the toggling of the clock signal included in the control signal CONT1 provided to the gate driver 20. When the toggling of the clock signal applied to the gate driver 20 is disabled, power consumption of the display device 1 may be reduced.

In an embodiment, the display device 1 may further include a hold signal generator 70 that controls the output of the gate signal from the gate driver 20 to maintain an off-voltage level stable while operating in the self-scan mode. The hold signal generator 70 outputs a hold signal VVF to the gate driver 20, which can control the gate signal output from the gate driver 20 to maintain an off-voltage level during a self-scan period when the gate driver 20 is operating in self-scan mode, while the toggling of the clock signal is disabled. For example, the hold signal generator 70 may control the compensation signal output from the gate driver 20 to maintain the off-voltage level while toggling of the clock signal is disabled. Additionally, for example, the hold signal generator 70 may control the initialization signal output from the gate driver 20 to maintain the off-voltage level while toggling of the clock signal is disabled. The hold signal generator 70 may receive a control signal CONT5 from the signal controller 60 and output the hold signal VVF to the gate driver 20 in response to the received control signal CONT5.

Although FIG. 1 shows an example in which the hold signal generator 70 is implemented separately, the hold signal generator 70 may be integrated into other components of the display device 1. For example, the hold signal generator 70 may be integrated within the gate driver 20, the power supply 50, or the signal controller 60.

The display device 1 according to an embodiment may be implemented as an electronic device, such as a cell phone, smartphone, laptop computer, smart watch, navigation device, gaming machine, television, car head unit, laptop computer, tablet computer, personal media player PMP, personal digital assistant PDA, etc.

Figure 2:
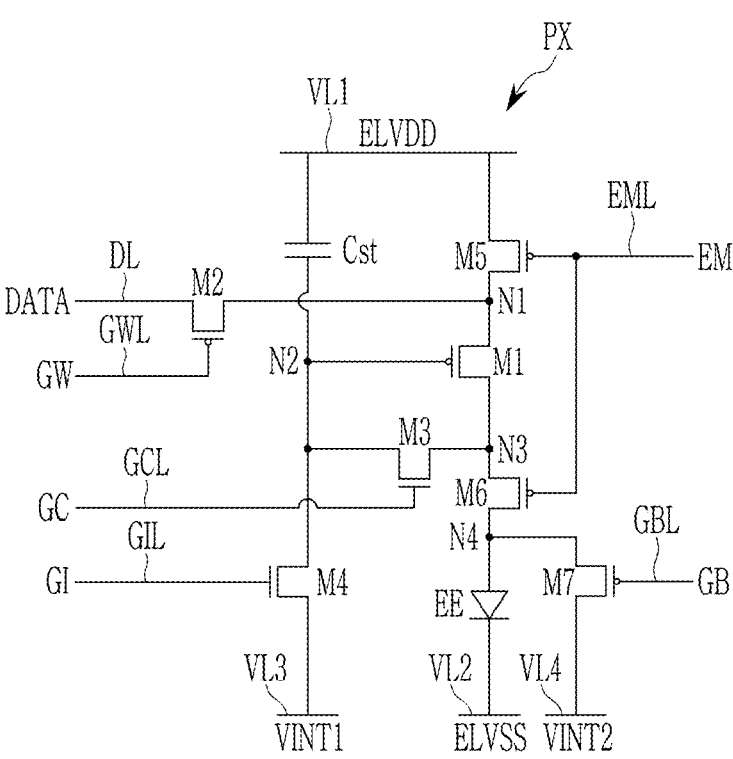
FIG. 2 shows an equivalent circuit of a pixel according to an embodiment.

FIG. 2 shows an equivalent circuit of a pixel according to an embodiment.

Referring to FIG. 2, each pixel PX included in the display panel 10 of the display device 1 according to an embodiment may include a plurality of transistors M1, M2, M3, M4, M5, M6, M7, a storage capacitor Cst, and a light emitting element EE.

The pixel PX may be connected to a plurality of signal lines. The signal lines in connection with the pixel PX may include a scan signal line GWL carrying a scan signal GW, first and second initialization signal lines GIL, GBL carrying first and second initialization signals GI, GB, and a compensation signal line GCL carrying a compensation signal GC.

The scan signal line GWL, the first initialization signal line GIL, the second initialization signal line GBL, and the compensation signal line GCL may be gate signal lines connected to the gate driver 20 of FIG. 1. That is, the scan signal GW, the first initialization signal GI, the second initialization signal GB, and the compensation signal GC may be gate signals output from the gate driver 20.

The signal lines connected to the pixel PX may further include a data signal line DL that transmits the data signal DATA output from the data driver 30 in FIG. 1, an light emitting control signal line EML that transmits the light emitting control signal EM output from the light emitting driver 40, first and second power lines VL1, VL2 that transmit first and second power voltages ELVDD, ELVSS, and first and second initialization voltage lines VL3, VL4 that transmit first and second initialization voltages VINT1, VINT2.

The first transistor M1 is a driving transistor and may include a first electrode connected to the first node N1, a second electrode connected to the third node, and a control electrode connected to the second node. The first node N1 may be connected to the first power line VL1 that supplies the first power voltage ELVDD via the fifth transistor M5. The first node N1 may be connected to the data signal line DL that transmits the data signal DATA via the second transistor M2. The second node N2 may be connected to the second electrode of the storage capacitor Cst. The second node N2 may be connected to the first initialization voltage line VL3 transmitting the first initialization voltage VINT1 via the fourth transistor M4. The second node N2 may be connected to the third node N3 via the third transistor M3. The third node N2 may be connected to the anode terminal of the light emitting element EE via the sixth transistor M6. The first transistor M1 may provide a driving current corresponding to the data signal DATA to the light emitting element EE.

The second transistor M2 is a switching transistor and may include a first electrode connected to a data signal line DL that transmits a data signal DATA, a second electrode connected to the first node N1, and a control electrode connected to a scan signal line GWL that transmits a scan signal GW. The second transistor M2 may be turned on in response to the scan signal GW received through the scan signal line GWL. When turned on, the second transistor M2 may transmit the data signal DATA transmitted through the data signal line DL to the first node N1 (i.e., the first electrode of the first transistor M1).

The third transistor M3 is a compensation transistor, which may include a first electrode connected to the second node N2, a second electrode connected to the third node N3, and a control electrode connected to the compensation signal line GCL carrying the compensation signal GC. The third transistor M3 may be turned on in response to the compensation signal GC received through the compensation signal line GCL. The third transistor M3, when turned on, may connect the second node N2 and the third node N3 (i.e., the second electrode and the control electrode of the first transistor (M1)) to each other, allowing the first transistor M1 to be diode-connected.

By the diode-connection of the first transistor M1, a data voltage, compensated for the threshold voltage of the first transistor M1, may be written to the storage capacitor Cst.

The fourth transistor M4 is an initialization transistor for initializing the voltage of the second node N2. The fourth transistor M4 may include a first electrode connected to the second node N2, a second electrode connected to a first initialization voltage line VL3 carrying a first initialization voltage VINT1, and a control electrode connected to a first initialization signal line GIL carrying a first initialization signal GI. The fourth transistor M4 may be turned on in response to the first initialization signal GI received through the first initialization signal line GIL. The fourth transistor M4 may transmit the first initialization voltage VINT1 to the second node N2 when turned on. When the first initialization voltage VINT1 is transmitted to the second node N2, the control electrode voltage of the first transistor M1 and the voltage of the storage capacitor Cst may be initialized by the first initialization voltage VINT1. The first initialization voltage VINT1 may have a voltage level lower than the voltage level of the data signal DATA. When the display panel 10 operates at a low driving frequency, if the first initialization voltage VINT1 supplied to the second node N2 is too low, the hysteresis change of the first transistor M1 becomes severe, causing a flicker phenomenon. Accordingly, the first initialization voltage VINT1 may have a higher voltage level than the second power voltage ELVSS.

The fifth transistor M5 is an operation control transistor of the pixel PX, which may include a first electrode connected to the first power line VL1 supplying the first power supply voltage ELVDD, a second electrode connected to the first node N1, and a control electrode connected to the light emitting control signal line EML carrying the light emitting control signal EM.

The sixth transistor M6 is a light emission control transistor, which may include a first electrode connected to the third node N3, a second electrode connected to the fourth node N4, and a control electrode connected to the light emission control signal line EML carrying the light emission control signal EM. The fourth node N4 may be connected to the anode terminal of the light emitting element EE.

Both the fifth transistor M5 and the sixth transistor M6 may be turned on simultaneously in response to the light emitting control signal EM received through the light emitting control signal line EML. When both the fifth transistor M5 and the sixth transistor M6 are turned on, the driving current generated by the first transistor M1 may flow to the light emitting element EE.

The seventh transistor M7 is an initialization transistor for initializing the light emitting element EE, which may include a first electrode connected to the fourth node N4, a second electrode connected to the second initialization voltage line VLA carrying a second initialization voltage VINT2, and a control electrode connected to the second initialization signal line GBL carrying a second initialization signal GB. The seventh transistor M7 may be turned on in response to the second initialization signal GB received through the second initialization signal line GBL. The seventh transistor M7 may deliver the second initialization voltage VINT2 to the anode terminal of the light emitting element EE when turned on, thereby initializing the voltage of the anode terminal of the light emitting element EE to the second initialization voltage VINT2. When a second initialization voltage VINT2 is applied to the anode terminal of the light emitting element EE, the parasitic capacitor of the light emitting element EE is discharged, thereby preventing unintended micro-emission and improving the black expression capability of the pixel circuit. The second initialization voltage VINT2 may have the same or a different voltage level than the first initialization voltage VINT1. The second initialization voltage VINT2 may have a voltage level lower than the voltage level of the data signal DATA. When the second initialization voltage VINT2 supplied to the fourth node N4 is higher than a predetermined value, the parasitic capacitor of the light emitting element EE may not be discharged but rather charged. Accordingly, the second initialization voltage VINT2 may be set to a sufficiently low voltage (for example, a voltage lower than the second power voltage ELVSS) to discharge the parasitic capacitor of the light emitting element EE.

The storage capacitor Cst may include a first electrode connected to the first power line VL1 transmitting the first power voltage ELVDD, and a second electrode connected to the second node N2. The storage capacitor Cst may store a data voltage corresponding to the data signal DATA.

The light emitting element EE may include an anode terminal connected to a fourth node N4, and a cathode terminal connected to a second power line VL2 that transmits a second power voltage ELVSS. The light emitting element EE may emit light by receiving the driving current generated by the first transistor M1.

One of the first and second electrodes of each transistor (M1, M2, M3, M4, M5, M6, M7) constituting the pixel circuit may be a drain electrode, and the other may be a source electrode. Additionally, the control electrode of each transistor M1, M2, M3, M4, M5, M6, M7 may be a gate electrode.

In FIG. 2, the pixel circuit is shown as including five p-type transistors M1, M2, M5, M6, M7 and two n-type transistors M3, M4, but the type of each transistor is not particularly limited thereto.

Figure 3:
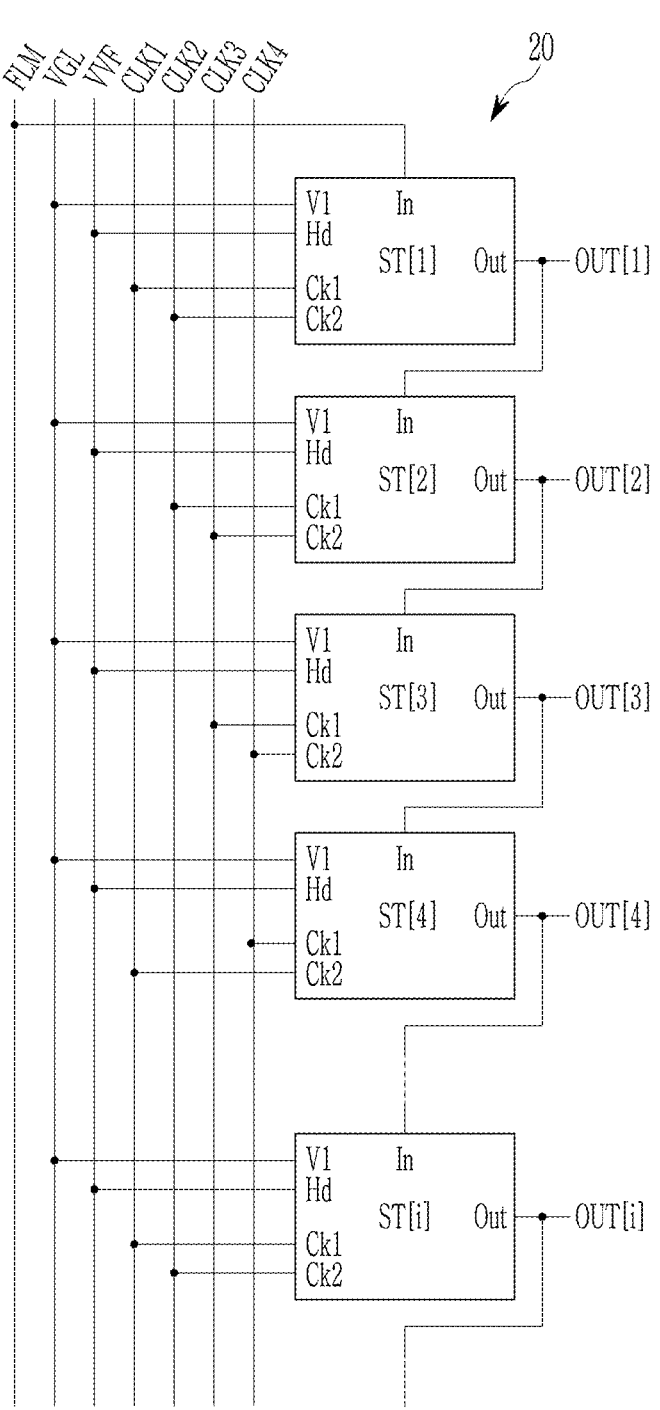
FIG. 3 schematically shows a gate driver according to an embodiment.

FIG. 3 schematically shows a gate driver according to an embodiment.

Figure 4:
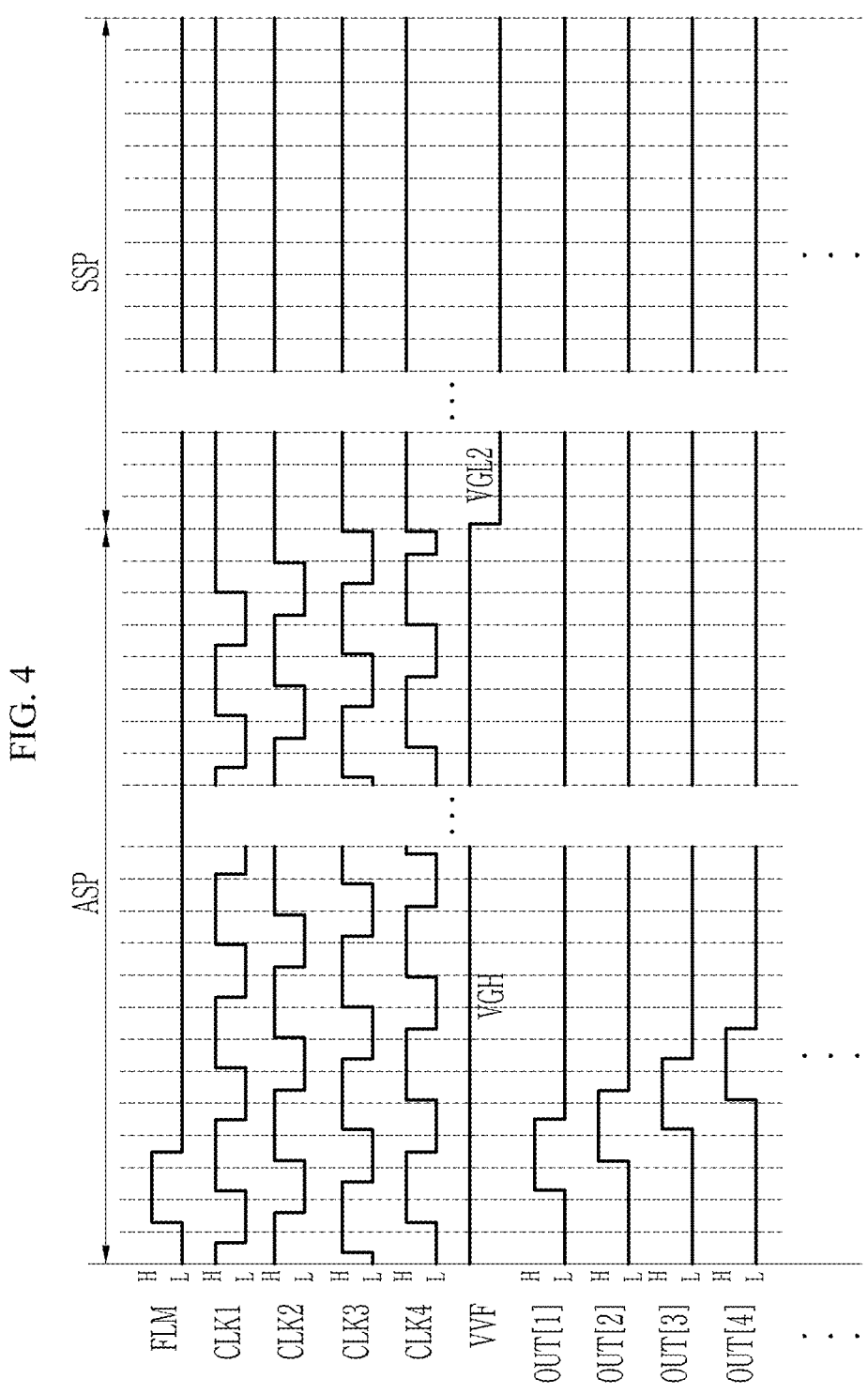
FIG. 4 is a timing diagram for explaining the operation of a gate driver according to an embodiment.

Additionally, FIG. 4 is a timing diagram for explaining the operation of a gate driver according to an embodiment.

Referring to FIGS. 1 and 3, the gate driver 20 according to an embodiment may receive a control signal CONT1 from the signal controller 60. The control signal CONT1 received from the signal controller 60 may include an external signal FLM used as a start signal of the first stage ST[1], and a plurality of clock signals CLK1 to CLK4. The gate driver 20 may also receive the hold signal VVF from the hold signal generator 70.

The gate driver 20 may include a plurality of stages (ST: ST[1], ST[2], ST[3], ST[4], . . . . ST[i] . . . ). Each stage ST may be connected to a corresponding gate signal line among the gate signal lines GL of the display panel 10. The output signals (OUT: OUT[1], OUT[2], OUT[3], OUT[4], . . . , OUT[i] . . . ) of each stage ST may be supplied as gate signals to the corresponding gate signal lines GL.

Each stage ST may include a shift register for outputting an output signal OUT in response to an input start signal. The stages ST are connected to each other dependently and may be driven in a sequential driving manner. Among the stages ST, the first stage ST[1] starts driven by the external signal FLM and the remaining stages (ST[2], ST[3], ST[4], . . . , ST[i], . . . ) may be started by the output signal OUT from the previous stage. That is, the output signal OUT from each stage ST may be applied not only as a gate signal to the corresponding gate signal line GL, but also as a start signal of the subsequent stage.

Each stage ST may include an input terminal In, first and second clock terminals Ck1, Ck2, a power terminal V1, a hold terminal Hd, and an output terminal Out.

An external signal FLM or an output signal (OUT[1], OUT[2], OUT[3], OUT[4], . . . , OUT[i] . . . ) from the previous stage may be input as a start signal to the input terminal In of each stage ST. An external signal FLM may be input to the input terminal In of the first stage ST1 as a start signal. The output signal of the preceding stage may be input as a start signal to the input terminal In of the subsequent stages following the first stage ST1.

Two corresponding clock signals from among the plurality of clock signals CLK1 to CLK4 may be input to the first and second clock terminals Ck1 and Ck2 of each stage ST. As shown in FIG. 4, the plurality of clock signals CLK1 to CLK4 may be square wave signals having alternating periods of the high-level voltage H and the low-level voltage L. For example, the plurality of clock signals CLK1 to CLK4 may be square wave signals in which a first voltage VGL, which is a low-level voltage, and a second voltage VGH, which is a high-level voltage, alternate repeatedly. A plurality of clock signals CLK1 to CLK4 may have the same period. The plurality of clock signals CLK1 to CLK4 may be set so that the period for maintaining the high-level voltage H is longer than the period for maintaining the low-level voltage L. The plurality of clock signals CLK1 to CLK4 may have a predetermined phase difference from each other as shown in FIG. 4. For example, the plurality of clock signals CLK1 to CLK4 may have an approximate phase difference of 90 degrees between one another. The plurality of clock signals CLK1 to CLK4 may be sequentially phase-shifted and input to the gate driver 20 so that their high-level voltage (H) periods partially overlap with those of other clock signals.

Different clock signals may be input to the first and second clock terminals Ck1 and Ck2 of each stage ST. A pair of clock signals input to the first and second clock terminals Ck1 and Ck2 of each stage ST may have an approximate phase difference of 90 degrees. A pair of clock signals input to the first and second clock terminals Ck1 and Ck2 of each stage ST may be alternately selected according to the order of the stages. For example, the first and second clock terminals Ck1, Ck2 of the first stage ST[1] receive the first and second clock signals CLK1, CLK2, respectively, the first and second clock terminals Ck1, Ck2 of the second stage ST[2] receive the second and third clock signals CLK2, CLK3, respectively, and the first and second clock terminals Ck1, Ck2 of the third stage ST[3] receive the third and fourth clock signals CLK3, CLK4, respectively, and the first and second clock terminals Ck1, Ck2 of the fourth stage ST[4] may receive the fourth and first clock signals CLK4, CLK1, respectively. Clock signal pairs input to the first and second clock terminals Ck1 and Ck2 of each stage ST may be repeated in units of four stages ST.

A first voltage VGL may be input to the power terminal V1. The first voltage VGL may be supplied from the signal controller 60 of FIG. 1 or the power supply 50.

The output terminal Out of each stage ST may be connected to the corresponding gate signal line GL. The output signal OUT output through the output terminal Out of each stage ST may be provided as a gate signal of the corresponding pixel PX through the corresponding gate signal line GL. For example, the output terminal Out of each stage ST is connected to a corresponding scan signal line GWL, and the output signal OUT of each stage ST may be supplied as a scan signal GW to a corresponding pixel PX. For example, the output terminal Out of each stage ST is connected to a corresponding compensation signal line GCL, and the output signal OUT of each stage ST may be supplied as a compensation signal GC to a corresponding pixel PX. For example, the output terminal Out of each stage ST is connected to a corresponding initialization signal line GIL, and the output signal OUT of each stage ST may be supplied as a first initialization signal GI of a corresponding pixel PX.

The output signal OUT output through the output terminal Out of each stage ST may be applied as a start signal (or carry signal) to the input terminal In of the next stage.

The output signal OUT output from each stage ST may be output in synchronization with the clock signal applied to the first clock terminal Ck1. In other words, in each stage ST, the period of the high level H of the output signal OUT may match the period of the high level H of the clock signal applied to the first clock terminal Ck1. Referring to FIG. 4, an output signal OUT[1] output from a first stage ST[1] may be output in synchronization with a first clock signal CLK1, an output signal OUT[2] output from a second stage ST[2] may be output in synchronization with a second clock signal CLK2, and an output signal OUT[3] output from a third stage ST[3] may be output in synchronization with a third clock signal CLK3, and an output signal OUT[4] output from the fourth stage ST[4] may be output in synchronization with the fourth clock signal CLK4. The output signals OUT supplied to neighboring gate signal lines GL may have portions of their high level voltages partially overlap with each other.

Toggling of the plurality of clock signals CLK1 to CLK4 applied to the gate driver 20 may be enabled or disabled depending on the operation mode of the display device 1. Referring to FIG. 4, the toggling of the plurality of clock signals CLK1 to CLK4 may be enabled during an address scan period ASP when the display device 1 is operating in an address scan mode, and may be disabled during a self-scan period SSP when the display device 1 is operating in a self-scan mode. During the self-scan period SSP, the clock signals CLK1 to CLK4 whose toggling are disabled may continuously maintain a predetermined voltage level. For example, the clock signals CLK1 to CLK4 may maintain the high-level voltage H during the self-scan period SSP.

A hold signal VVF may be input to the hold terminal Hd. The hold signal VVF is used to control the output signal OUT of each stage ST to be maintained at a off-voltage level during the self-scan period SSP when the toggling of the clock signals CLK1 to CLK4 is disabled (i.e., the period when the clock signals CLK1 to CLK4 are held at a high level H).

The voltage level of the hold signal VVF may vary depending on the operation mode of the display device 1. Referring to FIG. 4, the hold signal VVF may change voltage levels to a second voltage VGH, which is a high-level voltage during the address scan period ASP, and a third voltage VGL2, which is a low-level voltage during the self-scan period SSP. The third voltage VGL2 may have a lower voltage level than the first voltage VGL.

Each stage ST may operate based on the hold signal VVF input to the hold terminal Hd, either to output the output signal OUT normally or maintain the voltage level of the output signal OUT at the off-voltage level. Referring to FIG. 4, each stage ST may maintain the voltage level of the output signal OUT at a low level L, which is the off-voltage level, when the hold signal VVF changes to the third voltage VGL2.

FIG. 3 and FIG. 4 illustrate the case in which there are four clock signals applied to the gate driver 20 as an example. However, the number of clock signals applied to the gate driver 20 is not particularly limited thereto.

Figure 5:
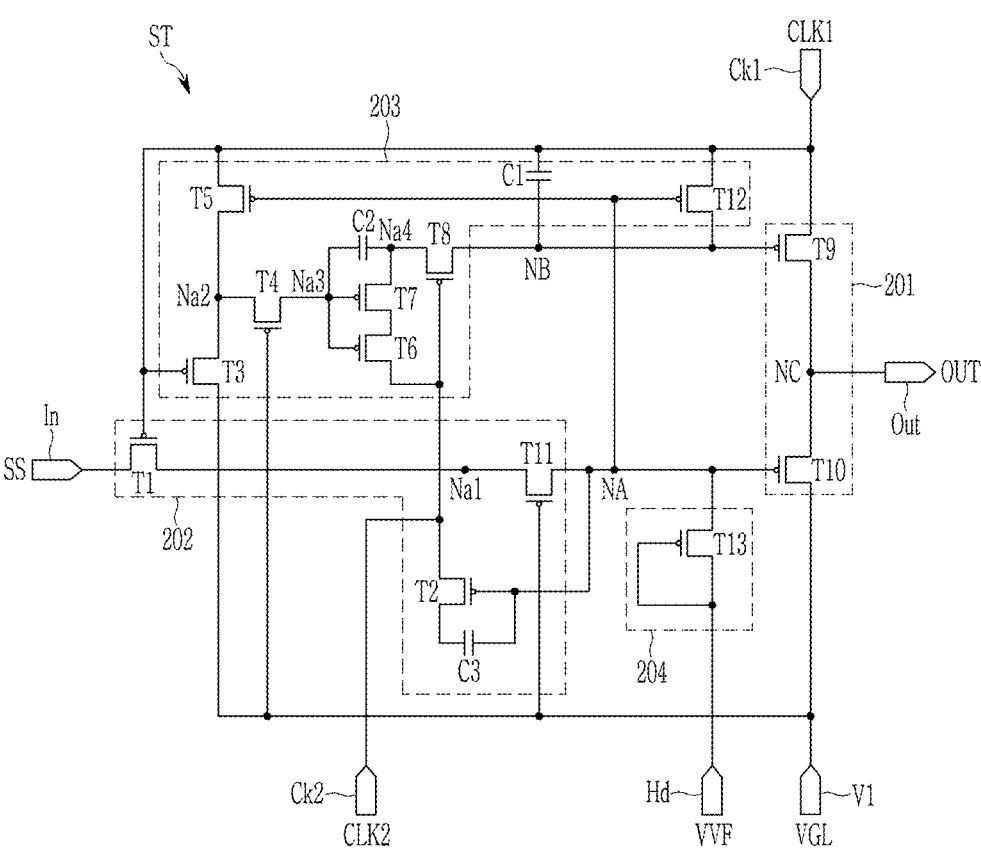
FIG. 5 shows an equivalent circuit of one stage constituting a gate driver according to an embodiment.

FIG. 5 shows an example of an equivalent circuit of one stage constituting a gate driver according to an embodiment. FIG. 5 illustrates, for example, a stage that receives first and second clock signals CLK1, CLK2 via first and second clock terminals Ck1, Ck2 and outputs a compensation signal GC to a corresponding pixel PX.

Referring to FIG. 5, each stage ST in the gate driver 20 may include an output node NC connected to a corresponding gate signal line GL, an output circuit 201 for outputting an output signal OUT to the output termina Out, a plurality of control nodes NA, NB for controlling the output of the output circuit 201, and a plurality of control circuits 202, 203 for controlling a voltage applied to each of the plurality of control nodes NA, NB.

The output circuit 201 may be connected between the first clock terminal Ck1 and the power terminal V1. The output circuit 201 may output an output signal OUT of a high-level voltage (for example, the second voltage VGH) or an output signal OUT of a low-level voltage (for example, the first voltage VGL) to the output node NC depending on the voltage level of the voltage applied to the first control node NA and the second control node NB. The output node NC is connected to the output terminal Out, and the output terminal Out may be connected to the corresponding compensation signal line GCL. Accordingly, the signal applied to the output node NC may be provided as a compensation signal GC to the corresponding compensation signal line GCL.

The output circuit 201 may include a ninth transistor T9 and a tenth transistor T10.

The ninth transistor T9 may include first and second electrodes respectively connected to the first clock terminal Ck1 and the output node NC, and a control electrode connected to the second control node NB. The ninth transistor T9 may be a pull-up transistor that connects the first clock terminal Ck1 to the output node NC in response to the voltage applied to the second control node NB. The ninth transistor T9, when turned-on, may deliver the first clock signal CLK1 input through the first clock terminal Ck1 to the output node NC by connecting the first clock terminal Ck1 and the output node NC.

The tenth transistor T10 may include first and second electrodes respectively connected to the output node NC and the power terminal V1, and a control electrode connected to the first control node NA. The tenth transistor T10 may be a pull-down transistor that connects the power terminal V1 to the output node NC in response to the voltage applied to the first control node NA. The tenth transistor T10, when turned-on, may deliver the power terminal V1 to the output node NC, thereby transmitting the low-level voltage VGL applied to the power terminal V1 to the output node NC.

The first control circuit 202 may be connected between the input terminal In and the first control node NA. The first control circuit 202 may control the voltage applied to the first control node NA in response to a start signal SS (an external signal FLM or an output signal of a shear stage) applied to the input terminal In, a first clock signal CLK1 applied to the first clock terminal Ck1, and a second clock signal CLK2 applied to the second clock terminal Ck2. The first control circuit 202 may include a first transistor T1, a second transistor T2, an 11th transistor T11, and a third capacitor C3.

The first transistor T1 may include first and second electrodes respectively connected to the input terminal In and the first node Na1, and a control electrode connected to the first clock terminal Ck1. The first transistor T1 may control the connection between the input terminal In and the first node Na1 in response to the first clock signal CLK1 applied to the first clock terminal Ck1. The first transistor T1, when turned-on, connects the input terminal In to the first node Na1, thereby transmitting the start signal SS input through the input terminal In to the first node Na1.

The eleventh transistor T11 may include first and second electrodes respectively connected to the first node Na1 and the first control node NA, and a control electrode connected to the power terminal V1. The eleventh transistor T11 connects the first node Na1 to the first control node NA when turned on, thereby transferring the voltage applied to the first node Na1 to the first control node Na1. The eleventh transistor T11 may be maintained in a turned-on state by the low-level voltage VGL applied to the power terminal V1.

The second transistor T2 may include first and second electrodes respectively connected to the second clock terminal Ck2 and one end of the third capacitor C3, and a control electrode connected to the other end of the third capacitor C3 and the first control node NA. The third capacitor C3 may be connected between the second electrode and the control electrode of the second transistor T2. The second transistor T2 and the third capacitor C3 are included as a bootstrap circuit for controlling the voltage level of the first control node NA, and the second transistor T2 may be a control transistor of the bootstrap circuit. When the second transistor T2 is turned on, the voltage level of the first control node NA may be lower than the voltage level of the second clock signal CLK2 input through the second clock terminal Ck2 due to the charge accumulated in the third capacitor C3. For example, when a low-level voltage is applied to the first control node NA so that the second transistor T2 is turned on and the voltage level of the second clock signal CLK2 input through the second clock terminal Ck2 changes from a high level to a low level, the voltage at the first control node NA may be lowered than the low-level voltage VGL of the second clock signal CLK2 by the third capacitor C3.

The second control circuit 203 may be connected between the power terminal V1 and the second control node NB. The second control circuit 203 may control the voltage of the second control node NB in response to a first clock signal CLK1 applied to the first clock terminal Ck1 and a second clock signal CLK2 applied to the second clock terminal Ck2. The second control circuit 203 may include a third transistor T3, a fourth transistor T4, a fifth transistor T5, a sixth transistor T6, a seventh transistor T7, an eighth transistor T8, and a twelfth transistor T12. The second control circuit 203 may further include a first capacitor C1 and a second capacitor C2.

The third transistor T3 may include first and second electrodes respectively connected to the second node Na2 and the power terminal V1, and a control electrode connected to the first clock terminal Ck1. The third transistor T3 may control the connection between the power terminal V1 and the second node Na2 in response to the voltage applied to the first clock terminal Ck1. The third transistor T3 connects the power terminal V1 to the second node Na2 when turned on, thereby transmitting the low-level voltage VGL applied to the power terminal V1 to the second node Na2.

The fourth transistor T4 may include first and second electrodes respectively connected to the second node Na2 and the third node Na3, and a control electrode connected to the power terminal V1. The fourth transistor T4 may control the connection between the second node Na2 and the third node Na3 in response to the voltage applied to the power terminal V1. The fourth transistor T4 connects the second node Na2 to the third node Na3 when turned on, thereby transferring the voltage applied to the second node Na2 to the third node Na3. The fourth transistor T4 may be maintained in a turned-on state by the low-level voltage VGL applied to the power terminal V1.

The sixth and seventh transistors T6 and T7 may be connected in series between the second clock terminal Ck2 and the fourth node Na4. The sixth transistor T6 may include a first electrode connected to the second clock terminal Ck2, a second electrode connected to the fourth node Na4 via the seventh transistor T7, and a control electrode connected to the third node Na3. The seventh transistor T7 may include a first electrode connected to the second clock terminal Ck2 via the sixth transistor T6, a second electrode connected to the fourth node Na4, and a control electrode connected to the third node Na3. The sixth transistor T6 and the seventh transistor T7 may control the connection between the second clock terminal Ck2 and the fourth node Na4 in response to the voltage applied to the third node Na3. The sixth transistor T6 and the seventh transistor T7, when turned-on, may deliver the second clock signal CLK2 applied to the second clock terminal Ck2 to the fourth node Na4 by connecting the second clock terminal Ck2 and the fourth node Na4.

The seventh transistor T7 is to minimize leakage current and may be omitted. If the seventh transistor T7 is omitted, the second electrode of the sixth transistor T6 may be connected to the fourth node Na4 without passing through the seventh transistor T7.

The eighth transistor T8 may include first and second electrodes respectively connected to the fourth node Na4 and the second control node NB, and a control electrode connected to the second clock terminal Ck2. The eighth transistor T8 may control the connection between the fourth node Na4 and the second control node NB in response to the second clock signal CLK2 input through the second clock terminal Ck2. A second capacitor C2 may be connected between the third node Na3 and the fourth node Na4. The eighth transistor T8 and the second capacitor C2 are included as a bootstrap circuit for controlling the voltage level of the second control node NB, and the eighth transistor T8 may be a control transistor of the bootstrap circuit. When the eighth transistor T8 is turned on, the voltage level of the second control node NB may be maintained lower than the voltage level of the third node Na3 due to the charge accumulated in the second capacitor C2.

The twelfth transistor T12 may include first and second electrodes respectively connected to the first clock terminal Ck1 and the second control node NB, and a control electrode connected to the first control node NA. The twelfth transistor T12 may control the connection between the first clock terminal Ck1 and the second control node NB in response to the level of the voltage applied to the first control node NA.

The first clock terminal Ck1 and the second control node NB may be connected to the first electrode and the control electrode of the ninth transistor T9, respectively. Accordingly, the twelfth transistor T12 may operate as a control transistor that controls the turn-off of the ninth transistor T9 in response to the level of the voltage applied to the first control node NA. When the twelfth transistor T12 is turned on, the first electrode and the control electrode (source electrode and gate electrode) of the ninth transistor T9 are connected to each other, causing the ninth transistor T9 to be turned off. The twelfth transistor T12 may control the ninth transistor T9 to be turned off when the tenth transistor T10 is turned on.

The first capacitor C1 may be connected between the first clock terminal Ck1 and the second control node NB. The first capacitor C1 may be used together with the second capacitor C2 to maintain the voltage level of the second control node NB.

The second control circuit 203 may further include a fifth transistor T5. The fifth transistor T5 may include first and second electrodes respectively connected to the first clock terminal Ck1 and the second node Na2, and a control electrode connected to the first control node NA. The fifth transistor T5 may control the connection between the first clock terminal Ck1 and the second node Na2 in response to the voltage applied to the first control node NA. The fifth transistor T5, when turned on, may connect the first clock terminal Ck1 to the second node Na2, thereby transmitting the first clock signal CLK1 applied to the first clock terminal Ck1 to the second node Na2.

The fifth transistor T5 may be a short control transistor that prevents a short circuit between the first clock terminal Ck1 and the second clock terminal Ck2. When the voltage level of the first clock signal CLK1 is at a high level and the voltage level of the second clock signal CLK2 is at a low level while the fifth transistor T5 is turned on, the eighth transistor T8 is turned on in response to the second clock signal CLK2 having the low level, and the high-level voltage of the first clock signal CLK1 may be delivered to the third node Na3 through the turned-on fifth transistor T5 and the fourth transistor T4. As a result, the third node Na3 may have the high-level voltage of the first clock signal CLK1 and turn off the sixth and seventh transistors T6, T7. Accordingly, the twelfth transistor T12, the eighth transistor T8, the sixth transistor T6, and the seventh transistor T7 may prevent a short from occurring between the first clock terminal Ck1 and the second clock terminal Ck2.

The stage ST may further include a hold circuit 204. The hold circuit 204 may be connected between the first control node NA and the hold terminal Hd. The hold circuit 204 may control the voltage of the first control node NA in response to the hold signal VVF applied to the hold terminal Hd. The hold circuit 204 may include a thirteenth transistor T13. The thirteenth transistor T13 may include a first electrode connected to the first control node NA, a second electrode connected to the hold terminal Hd, and a control electrode. When turned on, the thirteenth transistor T13 may transmit the hold signal VVF applied to the hold terminal Hd to the first control node NA.

One of the first and second electrodes of each transistor T1, T2, T3, T4, T5, T6, T7, T8, T9, T10, T11, T12, T13 constituting the stage ST is a drain electrode, and the remaining one may be a source electrode. Additionally, the control electrode of each transistor T1, T2, T3, T4, T5, T6, T7, T8, T9, T10, T11, T12, T13 may be a gate electrode.

In FIG. 5, a plurality of transistors T1, T2, T3, T4, T5, T6, T7, T8, T9, T10, T11, T12, T13 constituting the stage ST are shown as p-type transistors, but the type of each transistor is not particularly limited thereto. For example, at least one of the plurality of transistors (T1, T2, T3, T4, T5, T6, T7, T8, T9, T10, T11, T12, T13) included in the stage ST may be an n-type transistor.

FIG. 5 shows an example where the hold signal VVF and the hold circuit 204 are applied to the stage ST that outputs the compensation signal GC to the compensation transistor T3 of the corresponding pixel PX. However, the hold signal VVF and hold circuit 204 may also be applied to a stage ST that outputs other types of gate signals. The hold signal VVF and the hold circuit 204 may also be applied to other types of stages ST that provide gate signals to n-type transistors among the transistors included in the pixel PX. For example, the hold signal VVF and the hold circuit 204 may be applied to the stage ST that provides the initialization signal GI to the initialization transistor M4 of the corresponding pixel PX. When applied to a different type of stage ST, the hold circuit 204 may be connected to the control electrodes of transistors connected to the output terminal Out of the corresponding stage ST, which are connected between the power terminal V1 and the output terminal Out.

Hereinafter, a method of driving each stage ST in the gate driver 20 will be described in detail with reference to FIGS. 6 and 7.

Figure 6:
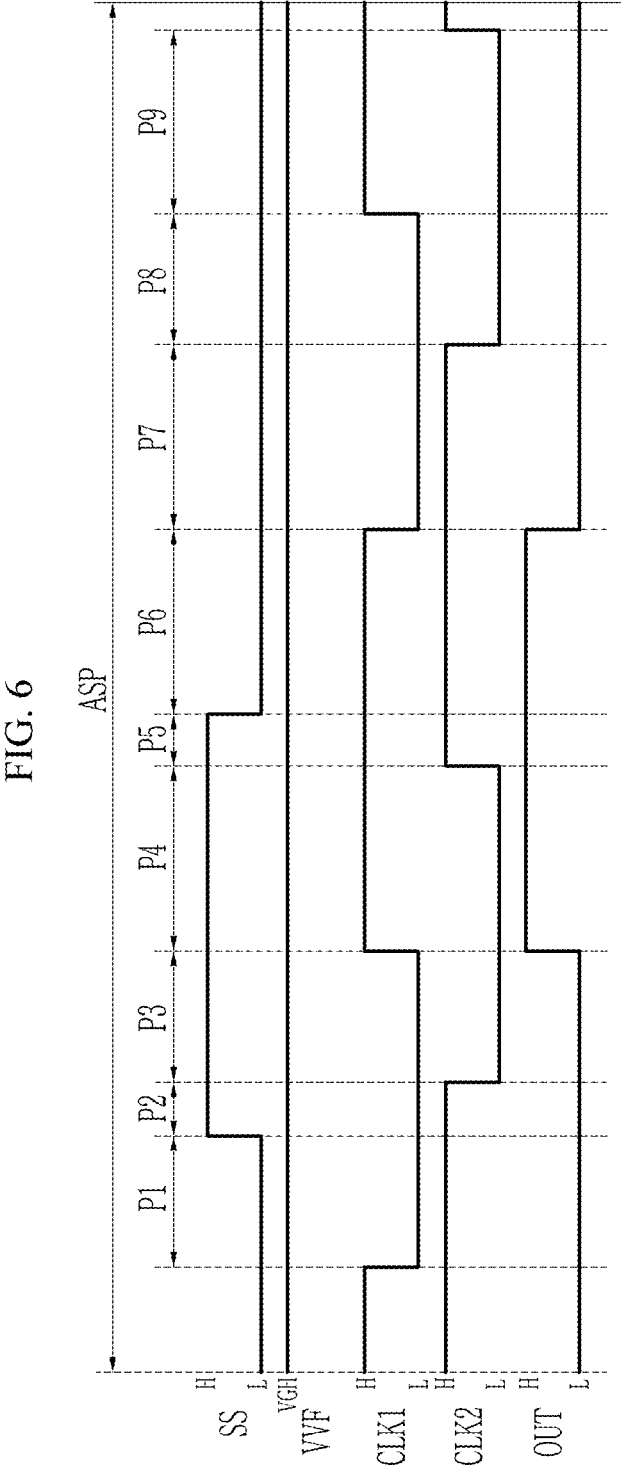
FIG. 6 is a timing diagram for explaining operations of a stage during an address scan period according to an embodiment.
Figure 7:
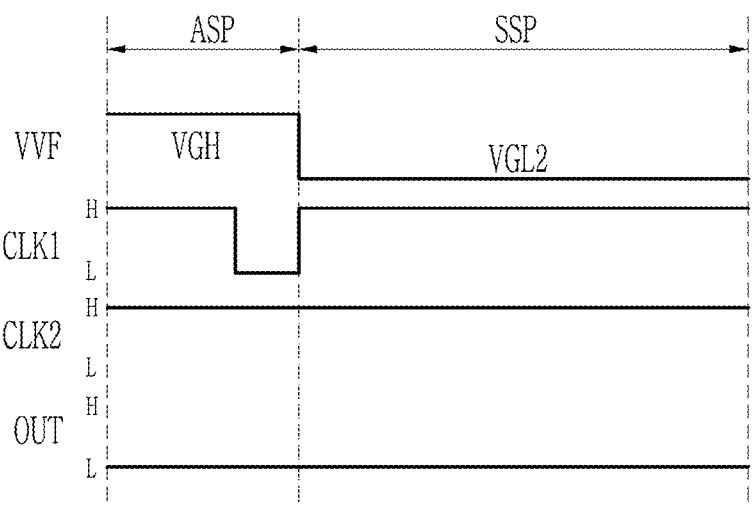
FIG. 7 is a timing diagram for explaining operations of a stage during a self-scan period according to an embodiment.

FIG. 6 is a timing diagram illustrating operations of a stage during an address scan period according to an embodiment, and FIG. 7 is a timing diagram illustrating operations of a stage during a self-scan period according to an embodiment.

Referring to FIG. 6, during the address scan period ASP, the hold signal VVF may maintain a high-level voltage (e.g., second voltage VGH). Accordingly, the thirteenth transistor T13 of the hold circuit 204 may remain turned off during the address scan period ASP.

During the first period P1 of the address scan period ASP, the voltage level of the start signal SS and the first clock signal CLK1 applied to the stage ST have a low level L (e.g., the first voltage VGL), and the voltage level of the second clock signal CLK2 has a high level H (e.g., the second voltage VGH).

In the first period P1, the first transistor T1 may be turned on in response to a low-level voltage L of the first clock signal CLK1, and the eleventh transistor T11 may be kept turned on by a first voltage VGL, which is a low-level voltage. Additionally, the low-level voltage L of the start signal SS may be transmitted to the first control node NA through the first and eleventh transistors T1 and T11 that are turned on. Therefore, the tenth transistor T10, the twelfth transistor T12, and the fifth transistor T5 may remain turned on during the first period P1.

In the first period P1, the turned-on tenth transistor T10 may transmit the first voltage VGL, which is a low-level voltage, to the output node NC. Accordingly, a low-level L output signal OUT may be output through the output terminal Out connected to the output node NC. The turned-on twelfth transistor T12 connects the control electrode to the first electrode (gate electrode and source electrode) of the ninth transistor T9, and the ninth transistor T9 may maintain in the turned-off state.

In the first period P1, the second transistor T2 may be turned on in response to the low-level voltage of the first control node NA. As the second transistor T2 is turned on, the high-level voltage H of the second clock signal CLK2 may be applied to one terminal of the third capacitor C3. Accordingly, a voltage corresponding to the voltage difference between the high-level voltage H of the second clock signal CLK2 and the low-level voltage of the first control node NA may be charged in the third capacitor C3.

In the first period P1, the third transistor T3 may be turned on in response to the low-level voltage L of the first clock signal CLK1, and the fourth transistor T4 may remain turned on by the first voltage VGL, which is a low-level voltage. As the third and fourth transistors T3 and T4 are turned on, a low-level voltage may be transmitted to the third node Na3, and the sixth and seventh transistors T6 and T7 may be turned on. The eighth transistor T8 may be turned off in response to the high-level voltage H of the second clock signal CLK2.

In the second period P2, the voltage level of the start signal SS changes to a high level H, while the voltage levels of the first clock signal CLK1 and the second clock signal CLK2 remain at a low level L and a high level H, respectively. In the subsequent third period P3, the second clock signal CLK2 changes to a low level L, while the voltage levels of the start signal SS and the first clock signal CLK1 remain at a high level H and a low level L, respectively.

In the second period P2 and the third period P3, the first transistor T1 and the eleventh transistor T11 may remain turned on. Additionally, the high-level voltage H of the start signal SS may be transmitted to the first control node NA through the first and eleventh transistors T1 and T11 that are turned on. As a high-level voltage is applied to the first control node NA, the tenth transistor T10, the twelfth transistor T12, and the fifth transistor T5 may be turned off.

Additionally, in the second period P2 and the third period P3, the third transistor T3 and the fourth transistor T4 may remain turned on. Accordingly, the low-level voltage is transmitted to the third node Na3 through the third and fourth transistors T3 and T4, and the sixth and seventh transistors T6 and T7 may also remain turned on.

In the second period P2, the eighth transistor T8 may be maintained in a turned-off state in response to the high-level voltage H of the second clock signal CLK2. Additionally, the voltage of the second control node NB may be maintained at the low-level voltage of the previous period by the first capacitor C1. Accordingly, the ninth transistor T9 is turned on, and the low-level voltage L of the first clock signal CLK1 may be transmitted to the output node NC.

In the third period P3, the eighth transistor T8 may be turned on in response to the low-level voltage L of the second clock signal CLK2. When the eighth transistor T8 is turned on, a low-level voltage may be transmitted to the second control node NB through the turned-on sixth to eighth transistors T6 to T8. The low-level voltage transmitted to the second control node NB may be controlled to be lower than the low-level voltage of the third node Na3 by the charge accumulated in the second capacitor C2. Accordingly, the ninth transistor T9 remains turned on during the third period P3, and the low-level voltage L of the first clock signal CLK1 may be transmitted to the output node NC.

In the fourth period P4, the voltage level of the first clock signal CLK1 changes to a high level H, while the voltage levels of the start signal SS and the second clock signal CLK2 remain at a high level H and a low level L, respectively. In the following fifth period P5, the second clock signal CLK2 changes to a high level H, and the voltage levels of the start signal SS and the first clock signal CLK1 both maintain a high level H.

In the fourth period P4 and the fifth period P5, the first transistor T1 may be turned off in response to the high-level voltage H of the first clock signal CLK1. Accordingly, the tenth transistor T10, the twelfth transistor T12, and the fifth transistor T5, whose gate electrodes are connected to the first control node NA, may be turned off. In the fourth period P4, the third transistor T3 is turned off in response to the high-level voltage H of the first clock signal CLK1, but the voltage of the third node Na3 may maintain the low-level voltage of the previous period due to the second capacitor C2. Accordingly, the sixth and seventh transistors T6, T7 may remain turned on during the fourth period P4 and the fifth period P5.

In the fourth period P4, the eighth transistor T8 may remain turned on in response to the low-level voltage L of the second clock signal CLK2. Accordingly, the low-level voltage L of the second clock signal CLK2 may be transmitted to the second control node NB through the turned-on sixth to eighth transistors T6 to T8. Additionally, the ninth transistor T9 is turned on in response to the low-level voltage of the second control node NB so that the high-level voltage H of the first clock signal CLK1 may be supplied to the output node NC.

In the fifth period P5, the eighth transistor T8 may be turned off in response to the high-level voltage H of the second clock signal CLK2. Even if the eighth transistor T8 is turned off, the voltage of the second control node NB may be maintained at a low level by the first capacitor C1. Accordingly, the ninth transistor T9 remains turned on even in the fifth period P5, and the high-level voltage H of the first clock signal CLK1 may be supplied to the output node NC.

In the sixth period P6, the voltage level of the start signal SS changes to a low level L, while the voltage levels of the first clock signal CLK1 and the second clock signal CLK2 remain at a high level H.

In the sixth period P6, the first transistor T1, the third transistor T3, the fifth transistor T5, the tenth transistor T10, and the twelfth transistor T12 may be maintained in the turned-off state in response to the high-level voltage H of the first clock signal CLK1 and the second clock signal CLK2. Additionally, the voltage of the second control node NB is maintained at a low level by the first capacitor C1, and the ninth transistor T9 may be maintained in a turned-on state. Accordingly, during the sixth period P6, the high-level voltage H of the first clock signal CLK1 may be transmitted to the output node NC by the ninth transistor T9.

In the seventh period P7, the voltage level of the first clock signal CLK1 changes to a low level L, while the voltage levels of the start signal SS and the second clock signal CLK2 remain at a low level L and a high level H, respectively.

In the seventh period P7, the first transistor T1 may be turned on again in response to the low-level voltage L of the first clock signal CLK1. As the first transistor T1 is turned on, a low-level voltage L of the start signal SS may be supplied to the first control node NA via the first transistor T1 and the eleventh transistor T11. Additionally, the tenth transistor T10, the twelfth transistor T12, and the fifth transistor T5 may be turned on in response to the low-level voltage of the first control node NA.

In the seventh period P7, the turned-on twelfth transistor T12 may supply a low-level voltage L of the first clock signal CLK1 to the second control node NB. As, the first electrode and the control electrode of the ninth transistor T9 are connected by the twelfth transistor T12, the ninth transistor T9 may be turned off. Accordingly, in the seventh period P7, the low-level voltage VGL applied to the power terminal V1 (i.e., the first voltage VGL) may be supplied to the output node NC by the turned-on tenth transistor T10.

In the seventh period P7, the second transistor T2 may be turned on in response to the low-level voltage of the first control node NA. As the second transistor T2 is turned on, the third capacitor C3 may be charged with a charge corresponding to the voltage difference between the low-level voltage of the first control node NA and the high-level voltage of the second clock signal CLK2.

In the seventh period P7, the third transistor T3 may be turned on in response to the low-level voltage L of the first clock signal CLK1. Accordingly, a low-level voltage may be transmitted to the third node Na3 through the turned-on third and fourth transistors T3 and T4, and the sixth and seventh transistors T6 and T7 may be turned on. The eighth transistor T8 may be maintained in a turned-off state in response to the high-level voltage H of the second clock signal CLK2.

In the eighth period P8, the voltage level of the second clock signal CLK2 changes to a low level L, while the voltage levels of the start signal SS and the first clock signal CLK1 both remain at a low level L.

In the eighth period P8, the first transistor T1 and the third transistor T3 may remain turned on in response to the low-level voltage L of the first clock signal CLK1. Due to the turned-on first transistor T1 and the low-level voltage L of the start signal SS, the second transistor T2, the fifth transistor T5, and the twelfth transistor T12 may also remain in the turned-on state. Since the second transistor T2 is turned on, a voltage lower than the low-level voltage VGL of the second clock signal CLK2 may be applied to the first control node NA by the charge on the third capacitor C3.

Accordingly, the tenth transistor T10 is turned on, and the low-level voltage VGL may be transmitted to the output node NC through the turned-on tenth transistor T10. Additionally, as the first electrode and the control electrode of the ninth transistor T9 are connected by the turned-on twelfth transistor T12, the ninth transistor T9 may be maintained in a turned-off state.

In the ninth period P9, the voltage level of the first clock signal CLK1 changes to a high level H, while the voltage levels of the start signal SS and the second clock signal CLK2 both remain at a low level L.

In the ninth period P9, the first transistor T1 is turned off in response to the high-level voltage H of the first clock signal CLK1, but the first control node NA may maintain the low-level voltage of the previous period. Accordingly, the fifth transistor T5, the tenth transistor T10, and the twelfth transistor T12 may be maintained in the turned-on state, and the ninth transistor T9 may be maintained in the turned-off state by the turned-on twelfth transistor T12. Accordingly, in the ninth period P9, the first voltage VGL, which is the low-level voltage L, may be transmitted to the output node NC through the turned-on tenth transistor T10.

In the ninth period P9, the third transistor T3 is turned off in response to the high-level voltage H of the first clock signal CLK1, but the high-level voltage H of the first clock signal CLK1 may be delivered to the third node Na3 by the fourth and fifth transistors T4, T5, which are turned on.

Accordingly, the sixth and seventh transistors T6 and T7 may be turned off. At this time, the eighth transistor T8 is turned on in response to the low-level voltage L of the second clock signal CLK2, but as the sixth and seventh transistors T6, T7 are turned off, a short circuit may be prevented from occurring between the first clock terminal Ck1 and the second clock terminal Ck2 through the sixth to eighth transistors T6 to T8 and the twelfth transistor T12.

Referring to FIG. 7, when the address scan period (ASP) ends and the self-scan period (SSP) begins, both the first and second clock signals (CLK1 and CLK2) maintain a high level (H), and the hold signal (VVF) changes to a third voltage (VGL2) that is lower than the first voltage VGL.

In the self-scan period SSP, the first transistor T1 may be turned off in response to the high-level voltage H of the first clock signal CLK1, and the thirteenth transistor T13 may be turned on in response to the low-level voltage (third voltage (VGL2)) of the hold signal VVF. Accordingly, the low-level voltage (third voltage VGL2) of the hold signal VVF is transmitted to the first control node NA through the thirteenth transistor T13, and the tenth transistor T10 and the twelfth transistor T12, and the fifth transistor T5 may remain turned on. The turned-on twelfth transistor T12 connects the control electrode to the first electrode (gate electrode and source electrode) of the ninth transistor T9, and the ninth transistor T9 may maintain the turned-off state. The turned-on tenth transistor T10 may transmit the first voltage VGL, which is a low-level voltage, to the output node NC.

Therefore, during the self-scan period SSP, the low-level L output signal OUT may be stably output to the output terminal Out connected to the output node NC. Additionally, since toggling of the clock signals CLK1 and CLK2 is disabled during the self-scan period SSP, power consumption of the display device 1 may be reduced.

Figure 8:
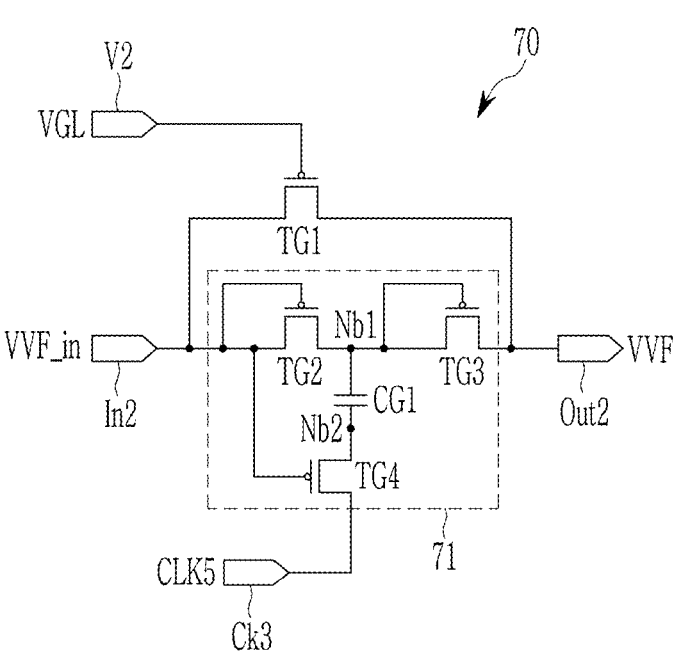
FIG. 8 shows an equivalent circuit of a hold signal generator according to an embodiment.

FIG. 8 shows an equivalent circuit of a hold signal generator according to an embodiment.

Figure 9:
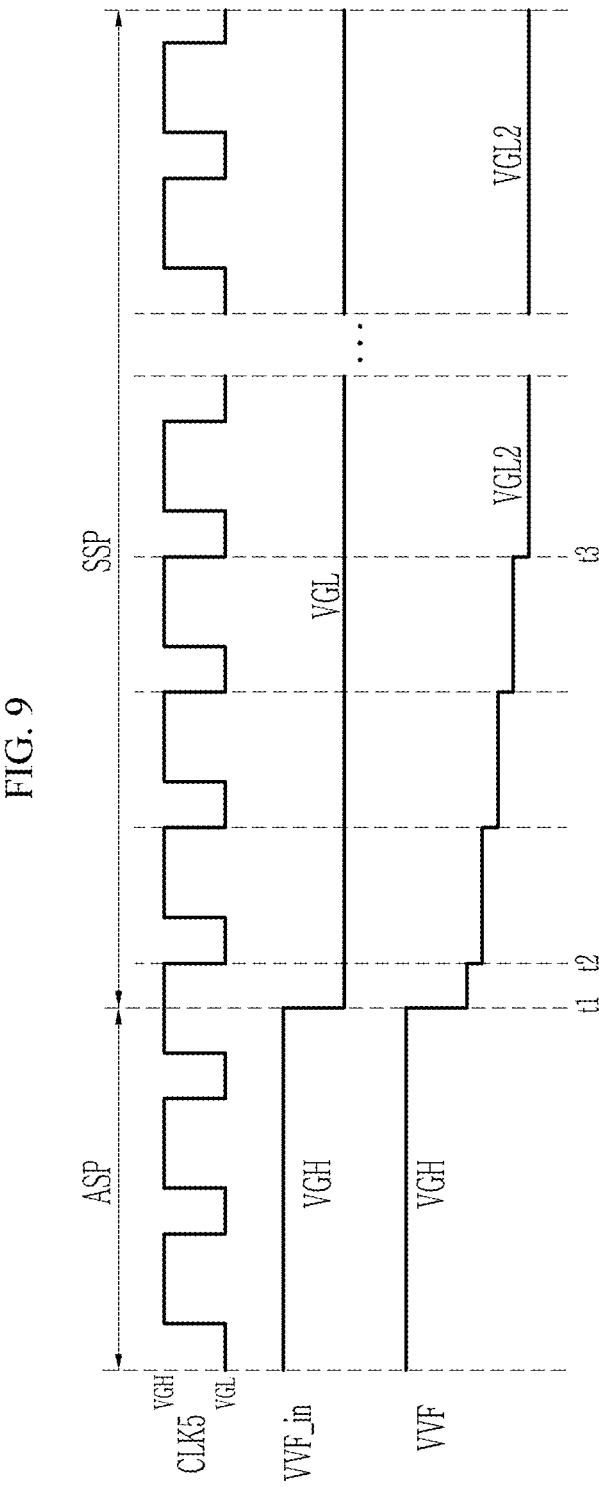
FIG. 9 is a timing diagram for explaining operations of a hold signal generator according to an embodiment.

Referring to FIG. 8, the hold signal generator 70 may receive a hold control signal VVF_in through an input terminal In2 and output a hold signal VVF through an output terminal Out2. The hold control signal VVF_in is a control signal CONT5 received from the signal controller 60, and the voltage level may vary depending on the operation mode of the display device 1. Referring to FIG. 9, during the address scan period ASP in which the display device 1 operates in the address scan mode, the hold signal VVF may maintain the high-level voltage VGH. During the self-scan period SSP when the display device 1 operates in self-scan mode, the hold signal VVF may gradually decrease from a high-level voltage VGH to a low-level voltage VGL2.

The hold signal generator 70 may include an input terminal In2 to which a hold control signal VVF_in is input, a clock terminal Ck3 to which a fifth clock signal CLK5 is input, a power terminal V2 to which a first voltage VGL is input, and an output terminal Out2 that outputs a hold signal VVF. The hold signal generator 70 may include a first transistor TG1 connected between the input terminal In2 and the output terminal Out2, and a charge pump circuit 71. The fifth clock signal CLK5 is a separate clock signal from the clock signals CLK1 to CLK4 applied to the gate driver 20, and may maintain toggling even during the self-scan period SSP.

The first transistor TG1 may include a first electrode connected to the input terminal In2, a second electrode connected to the output terminal Out2, and a control electrode connected to the power terminal V2. The first transistor TG1 may remain turned on while the voltage at the input terminal In2 is maintained at the high-level voltage VGH. When the voltage of the input terminal In2 changes to the low-level voltage VGL, the first transistor TG1 may be turned off depending on the voltage of the output terminal Out2. That is, the first transistor TG1 may be turned off when the voltage of the input terminal In2 changes to a low-level voltage VGL and the voltage of the output terminal Out2 becomes lower than the voltage VGL of the input terminal In2. When the first transistor TG1 is turned on, the hold control signal VVF_in input to the input terminal In2 may be transmitted to the output terminal Out2.

The charge pump circuit 71 may lower the voltage of the output terminal Out2 than the voltage VGL of the input terminal In2 when the voltage of the input terminal In2 is the low-level voltage VGL. The charge pump circuit 71 may include a second transistor TG2, a third transistor TG3, a fourth transistor TG4, and a capacitor CG1.

The second transistor TG2 may include a first electrode and a control electrode both of which are connected to the input terminal In2, and a second electrode connected to the first node Nb1. The third transistor TG3 may include a first electrode and a control electrode both of which are connected to the first node Nb1, and a second electrode connected to the output terminal Out2. Each of the second transistor TG2 and the third transistor TG3 is diode-connected and may perform the function of limiting the direction of current flow between the input terminal In2 and the first node Nb1, or between the first node Nb1 and the output terminal Out2.

The fourth transistor TG4 may include a first electrode connected to the clock terminal Ck3, a second electrode connected to the second node Nb2, and a control electrode connected to the input terminal In2. The fourth transistor TG4 may be turned on when the voltage level of the hold control signal VVF_in is at a low level VGL, and may be turned off when the voltage level of the hold control signal VVF_in is at a high level VGH. When turned on, the fourth transistor TG4 may transmit the fifth clock signal CLK5 input from the clock terminal Ck3 to the second node Nb2.

The capacitor CG1 may be connected between the first node Nb1 and the second node Nb2. When the high-level voltage VGH of the fifth clock signal CLK5 is delivered to the second node Nb2 via the fourth transistor TG4, the capacitor CG1 may be charged with a charge corresponding to the voltage difference between the high-level voltage VGH of the fifth clock signal CLK5 and the voltage of the first node Nb1.

When the low-level voltage VGL of the fifth clock signal CLK5 is delivered to the second node Nb2 via the fourth transistor TG4, the voltage delivered to the output terminal Out2, i.e., the voltage level of the hold signal VVF, may be lower than the first voltage VGL due to the capacitor CG1. As the pulse of the fifth clock signal CLK5 is repeated, the voltage level of the hold signal VVF gradually decreases and converges to the third voltage VGL2.

Hereinafter, a method of driving the hold signal generator 70 will be described with reference to FIG. 9.

FIG. 9 is a timing diagram for explaining operations of a hold signal generator according to an embodiment.

Referring to FIGS. 8 and 9, the hold control signal VVF_in maintains a high-level voltage VGH during the address scan period ASP and changes to a low-level voltage VGL during the self-scan period SSP.

The first transistor TG1 may remain turned on during the address scan period ASP. Accordingly, the high-level voltage VGH of the hold control signal VVF_in is transmitted to the output terminal Out2 through the first transistor TG1, and the high-level VGH hold signal VVF may be output.

At the first time point t1, the self-scan period SSP starts and the hold control signal VVF_in may change from a high level VGH to a low level VGL. At the first time point t1, the first transistor TG1 may remain turned on. Accordingly, the low-level voltage VGL of the hold control signal VVF_in may be transmitted to the output terminal Out2 through the first transistor TG1. At the first time point t1, the fourth transistor TG4 may be turned-on. Thus, the high-level voltage VGH of the fifth clock signal CLK5 is delivered to the second node Nb2, and the capacitor CG1 may be charged with a charge corresponding to the voltage difference between the high-level voltage VGH of the fifth clock signal CLK5 and the voltage of the first node Nb1.

At the second time point t2, the fifth clock signal CLK5 changes from a high level VGH to a low level VGL. Accordingly, the low-level voltage VGL of the fifth clock signal CLK5 is delivered to the second node Nb2 via the fourth transistor TG4, and the voltage level of the hold signal VVF may be lower than the first voltage VGL due to the charge on the capacitor CG1. Additionally, the first transistor TG1 may change to a turned-off state due to the voltage of the output terminal Out2 being lower than the first voltage VGL. Since the voltage of the first node Nb1 is lower than the first voltage VGL, the current flow between the input terminal In2 and the first node Nb1 is blocked by the second transistor TG2, and the current flow between the first node Nb1 and the output terminal Out2 may be maintained by the third transistor TG3.

Thereafter, when the fifth clock signal CLK5 turns to a high level VGH, the capacitor CG1 may be charged, and when the fifth clock signal CLK5 turns to a low level VGL, the voltage level of the hold signal VVF may be reduced by the charge on the capacitor CG1. Accordingly, the voltage level of the hold signal VVF may gradually decrease and converge to the third voltage VGL2 at the third time point t3.

The time taken for the voltage level of the hold signal VVF to converge to the third voltage VGL2 from the first time point t1 when the hold control signal VVF_in changes to a low level, and the level of the third voltage VGL2 may be determined by the capacitance of the capacitor CG1.

A display device 1 according to an embodiment may be applied to various electronic devices. An electronic device according to an embodiment may include the display device 1, and may further include modules or devices having additional functions other than the display device.

Figure 10:
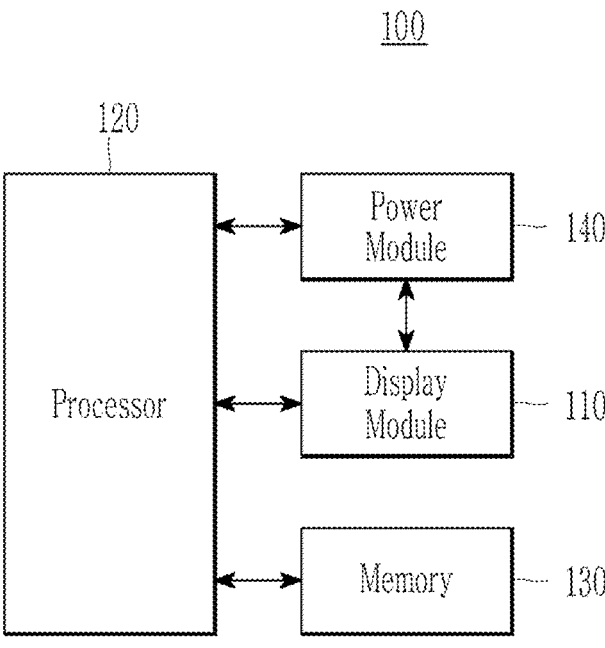
FIG. 10 is a block diagram of an electronic device according to some embodiments.

FIG. 10 is a block diagram of an electronic device according to some embodiments. Referring to FIG. 10, the electronic device 100 according to an embodiment may include a display module 110, a processor 120, a memory 130, and a power module 140.

The processor 120 may include at least one of a central processing unit (CPU), an application processor (AP), a graphic processing unit (GPU), a communication processor (CP), an image signal processor (ISP), and a controller.

The memory 130 may store data information necessary for operations of the processor 120 or the display module 110. When the processor 120 executes an application stored in the memory 130, image data signals and/or input control signals are transmitted to the display module 110, and the display module 110 can process the received signals to display image through the display screen.

The power module 140 may include a power supply module such as a power adapter or battery device, and a power conversion module that converts the power supplied by the power supply module to generate the power necessary for the operation of the electronic device 100.

At least one of components of the electronic device 100 may be included within the display device 1 according to the above-described embodiments. Additionally, some of the individual modules that are functionally included within a single module may be incorporated into the display device 1, while others may be provided separately from the display device 1. For example, the display device 1 may include the display module 110, while the processor 120, memory 130, and power module 140 may be provided in a form of other devices within the electronic device 100 that are not part of the display device 1.

Figure 11:
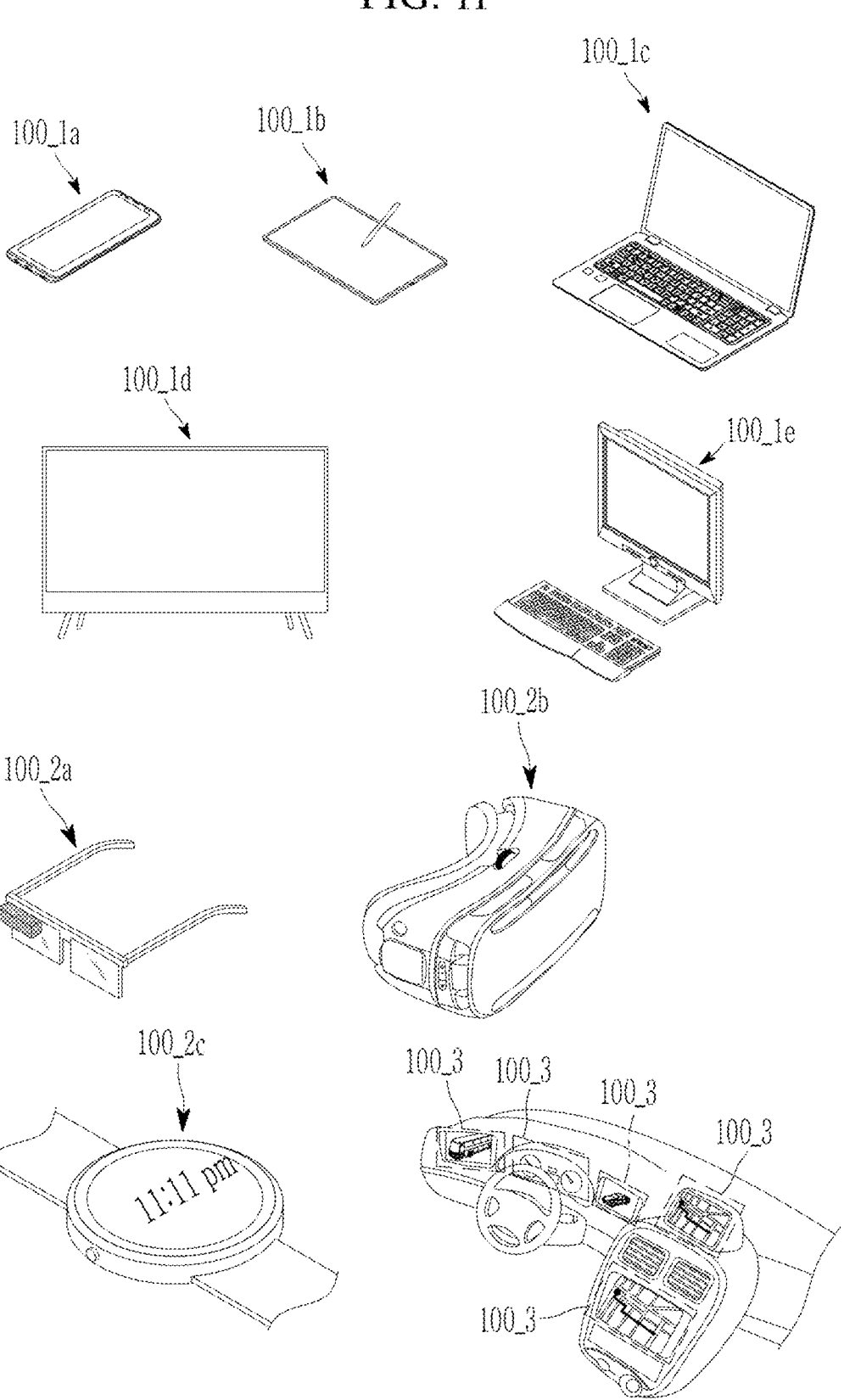
FIG. 11 shows schematic diagrams of electronic devices according to various embodiments.

FIG. 11 shows schematic diagrams of electronic devices according to various embodiments.

Referring to FIG. 11, various electronic devices with the display device according to the embodiments may include not only image display electronic devices such as smartphones 100_1a, tablet PCs 100_1b, laptops 100_1c, TVs 100_1d, desktop monitors 100_1e, but also wearable electronic devices with display modules such as smart glasses 100_2a, head-mounted displays 100_2b, smart watches 100_2c, as well as automotive electronic devices with display modules 100_3 such as those placed on car dashboards, center fascias, CID (Center Information Display), room mirror displays, and so on.

Although the embodiments of the present disclosure have been described in detail above, it is to be understood that the scope of the present disclosure is not limited to the disclosed embodiments. On the contrary, it is intended to cover various modifications and equivalent arrangements included within the spirit and scope of the appended claims.

What is claimed is:

1. A gate driver, comprising:
   a plurality of stages connected to a plurality of gate signal lines,
   wherein each of the plurality of stages comprises:
   a first transistor connected between a first terminal and an output node and transmitting a voltage of the first terminal to the output node in response to a voltage of a first control node;

a second transistor connected between a second terminal and the output node and transmitting a voltage of the second terminal to the output node in response to a voltage of a second control node; and
   a third transistor diode-connected between the second control node and a third terminal to which a hold signal is input,
   wherein the hold signal maintains a first voltage during a first period and maintains a second voltage, different from the first voltage, during a second period.

2. The gate driver of claim 1, wherein
   a third voltage is applied to the second terminal, and
   the first voltage is higher than the third voltage, and the second voltage is lower than the third voltage.

3. The gate driver of claim 2, wherein
   a first clock signal is applied to the first terminal, and
   the first clock signal is a signal having alternating periods of the first voltage and the third voltage.

4. The gate driver of claim 2, wherein the third transistor is turned on when the voltage level of the hold signal is the second voltage.

5. The gate driver of claim 4, wherein the second transistor is a p-type transistor.

6. The gate driver of claim 3, wherein
   each of the plurality of stages further includes a first control circuit configured to control a voltage level of the first control node.

7. The gate driver of claim 6, wherein the first control circuit comprises:
   a fourth transistor connected between a fourth terminal through which a start signal is input and a first node, and including a control electrode connected to the first terminal;
   a fifth transistor connected between the first node and the first control node and including a control electrode connected to the second terminal;
   a sixth transistor including a first electrode connected to a fifth terminal through which a second clock signal, different from the first clock signal, is input, and a control electrode connected to the first control node; and
   a first capacitor connected between a second electrode of the sixth transistor and the first control node.

8. The gate driver of claim 7, wherein
   toggling of the first clock signal and the second clock signal is enabled during the first period and disabled during the second period.

9. The gate driver of claim 3, wherein
   each of the plurality of stages further comprises a second control circuit configured to control a voltage level of the second control node.

10. The gate driver of claim 9, wherein the second control circuit comprises:
   a fourth transistor connected between the second terminal and a first node and including a control electrode connected to the first terminal;
   a fifth transistor connected between the first node and the second node and including a control electrode connected to the second terminal;
   a sixth transistor connected between a fifth terminal through which a second clock signal, different from the first clock signal, is input and a third node, and including a control electrode connected to the second node;
   a seventh transistor connected between the third node and the second control node and including a control electrode connected to the fifth terminal;

an eighth transistor connected between the first terminal and the second control node and including a control electrode connected to the first control node;

a ninth transistor connected between the first node and the first terminal and including a control electrode connected to the first control node;

a first capacitor connected between the second node and the third node; and a second capacitor connected between the first terminal and the second control node.

11. The gate driver of claim 10, wherein the second control circuit further comprises a tenth transistor connected between the sixth transistor and the third node and including a control electrode connected to the second node.

12. The gate driver of claim 1, wherein during the first period a data voltage is written to each pixel, and during the second period no data voltage is written to each pixel.

13. A display device, comprising:

a display panel including a plurality of pixels connected to a plurality of gate signal lines and a plurality of data signal lines;

a gate driver including a plurality of stages connected to the plurality of gate signal lines and configured to provide a plurality of gate signals; and a data driver connected to the plurality of data signal lines and configured to provide a plurality of data signals, wherein each of the plurality of stages comprises:

a first transistor connected between a first terminal and an output node and transmitting a voltage of the first terminal to the output node in response to a voltage of the first control node;

a second transistor connected between a second terminal and the output node and transmitting a voltage of the second terminal to the output node in response to a voltage of the second control node; and a third transistor diode-connected between the second control node and a third terminal to which a hold signal is input, wherein the hold signal maintains a first voltage during a first period and maintains a second voltage, different from the first voltage, during a second period.

14. The display device of claim 13, further comprising:

a hold signal generator configured to provide the hold signal, wherein the hold signal generator comprises:

a fourth terminal to which a hold control signal is input;

a fifth terminal through which the hold signal is output;

a fourth transistor connected between the fourth terminal and the fifth terminal and including a control electrode connected to a sixth terminal to which a third voltage is input; and a charge pump circuit configured to control a voltage level provided to the fifth terminal in response to the hold control signal and a clock signal.

15. The display device of claim 14, wherein the charge pump circuit comprises:

a fifth transistor diode-connected between the fourth terminal and a first node;

a sixth transistor diode-connected between the first node and the fifth terminal;

a seventh transistor including a first electrode to which a first clock signal is input, a second electrode connected to a second node, and a control electrode connected to the fourth terminal; and a capacitor connected between the first node and the second node.

16. The display device of claim 15, wherein the charge pump circuit is configured to provide the second voltage lower than the third voltage to the output terminal when the voltage level of the hold control signal is the third voltage.

17. The display device of claim 13, wherein a first clock signal is input to the first terminal, a third voltage is input to the second terminal, the first clock signal is a signal having alternating periods of the first voltage and the third voltage, and the first voltage is higher than the third voltage, and the second voltage is lower than the third voltage.

18. The display device of claim 13, wherein the third transistor is turned on when the voltage level of the hold signal is the second voltage, and the second transistor is turned on when the second voltage is transmitted to the second control node by the third transistor.

19. The display device of claim 18, wherein during the first period a data voltage is written to each pixel, and during the second period no data voltage is written to each pixel.

20. An electronic device, comprising:

a memory;

a processor executing an application stored in the memory; and a display device comprising a display module displaying image based on an input image data from the application, wherein the display device comprises:

a display panel including a plurality of pixels and displaying image based on an input image data from the application; and a gate driver including a plurality of stages and connected to the plurality of pixels to provide gate signals, wherein each of the plurality of stages comprises:

a first transistor connected between a first terminal and an output node and transmitting a voltage of the first terminal to the output node in response to a voltage of the first control node;

a second transistor connected between a second terminal and the output node and transmitting a voltage of the second terminal to the output node in response to a voltage of the second control node; and a third transistor diode-connected between the second control node and a third terminal to which a hold signal is input, wherein the hold signal maintains a first voltage during a first period and maintains a second voltage, different from the first voltage, during a second period.

* * * * *